United States Patent
Jochi (10) Patent No.: US 11,670,558 B2
(45) Date of Patent: Jun. 6, 2023

(54) SEMICONDUCTOR DEVICE (71) Applicant: Mitsubishi Electric Corporation, Tokyo (JP)

(72) Inventor: Masafumi Jochi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/846,557

(22) Filed: Apr. 13, 2020

(65) Prior Publication Data

US 2020/0381323 A1 Dec. 3, 2020

(30) Foreign Application Priority Data

May 31, 2019 (JP) .............................. JP2019-102527

(51) Int. Cl.
*H01L 23/31* (2006.01)
*H01L 23/495* (2006.01)
(Continued)

(52) U.S. Cl.
CPC ...... *H01L 23/3121* (2013.01); *H01L 23/4951* (2013.01); *H01L 23/49541* (2013.01); *H01L 23/49575* (2013.01); *H01L 23/49589* (2013.01); *H03K 17/08116* (2013.01); *H01L 24/48* (2013.01); *H01L 2224/48091* (2013.01);
(Continued)

(58) Field of Classification Search
CPC ............. H01L 23/3121; H01L 23/4951; H01L 23/49541; H01L 23/49575; H01L 23/49589; H03K 17/08116
See application file for complete search history.

(56) References Cited

U.S. PATENT DOCUMENTS 5,036,024 A * 7/1991 Mine .................... H01L 25/0652
29/827
5,362,679 A * 11/1994 Wakefield ............. H01L 23/315
29/827
(Continued)

FOREIGN PATENT DOCUMENTS

EP 2 365 522 A1 9/2011
EP 2 814 056 A1 12/2014
(Continued)

OTHER PUBLICATIONS

An Office Action; "Notice of Reasons for Refusal," mailed by the Japanese Patent Office dated Mar. 29, 2022, which corresponds to Japanese Patent Application No. 2019-102527 and is related to U.S. Appl. No. 16/846,557 with English language translation.

*Primary Examiner* — Eugene Lee
(74) *Attorney, Agent, or Firm* — Studebaker & Brackett PC (57) ABSTRACT

A semiconductor device includes a semiconductor element, a die pad, an encapsulating member, and a plurality of leads. The die pad has a front surface on which the semiconductor element is mounted. The encapsulating member covers and seals the semiconductor element. The plurality of leads each have a first end connected to the semiconductor element in an inside of the encapsulating member and a second end led out from a side surface of the encapsulating member. A lower surface of a package including the semiconductor element, the die pad, and the encapsulating member is located on a back surface side of the die pad and has a convexly curved shape.

13 Claims, 9 Drawing Sheets (51) Int. Cl.
*H03K 17/081* (2006.01)
*H01L 23/00* (2006.01)

(52) U.S. Cl.
CPC ............... *H01L 2224/48137* (2013.01); *H01L 2224/48175* (2013.01)

(56) References Cited

U.S. PATENT DOCUMENTS

| | | | | |
|---|---|---|---|---|
| 5,847,458 A * | 12/1998 | Nakamura | ............... | H01L 24/16 257/738 |
| 6,191,494 B1 * | 2/2001 | Ooyama | ............... | H01L 21/568 257/675 |
| 6,242,284 B1 * | 6/2001 | Kang | ............... | H01L 21/486 257/E23.067 |
| 6,365,980 B1 * | 4/2002 | Carter, Jr. | ............... | H01L 21/565 257/787 |
| 6,423,643 B1 * | 7/2002 | Furuhata | ............... | H01L 24/48 438/694 |
| 6,441,502 B2 * | 8/2002 | Yamada | ............... | H01L 21/4832 257/773 |
| 6,583,505 B2 * | 6/2003 | Choi | ............... | H01L 23/3735 257/730 |
| 6,818,973 B1 * | 11/2004 | Foster | ............... | H01L 24/49 257/676 |
| 6,864,423 B2 * | 3/2005 | Tan | ............... | H01L 21/4842 174/536 |
| 7,633,157 B2 * | 12/2009 | Jiang | ............... | H01L 23/3128 438/126 |
| 8,455,988 B2 * | 6/2013 | Caparas | ............... | H01L 21/4832 257/676 |
| 9,245,863 B2 * | 1/2016 | Yu | ............... | H01L 24/14 |
| 10,170,339 B2 * | 1/2019 | Lin | ............... | H01L 23/3114 |
| 10,796,984 B2 * | 10/2020 | Rodriguez | ............... | H01L 21/565 |
| 10,964,660 B1 * | 3/2021 | Alfandari | ............... | H01L 24/73 |
| 10,978,371 B2 * | 4/2021 | Kai | ............... | H01L 21/4817 |
| 2001/0052600 A1 * | 12/2001 | Sakamoto | ............... | H01L 33/486 257/79 |
| 2002/0041012 A1 * | 4/2002 | Sakamoto | ............... | G11B 5/4853 257/678 |
| 2002/0171134 A1 | 11/2002 | Choi | | |
| 2008/0258278 A1 * | 10/2008 | Ramos | ............... | H01L 21/4832 257/676 |
| 2010/0259908 A1 * | 10/2010 | Sutardja | ............... | H01L 23/49503 361/760 |
| 2011/0062569 A1 * | 3/2011 | Yow | ............... | H01L 23/4951 257/676 |
| 2014/0374896 A1 | 12/2014 | Nishida et al. | | |
| 2015/0318247 A1 * | 11/2015 | Kunimitsu | ............... | H01L 23/293 257/676 |
| 2016/0056091 A1 * | 2/2016 | Kim | ............... | H01L 23/552 257/368 |
| 2018/0190575 A1 * | 7/2018 | Rodriguez | ............... | H01L 23/49555 |
| 2019/0067212 A1 * | 2/2019 | Cadag | ............... | H01L 23/49582 |
| 2019/0198454 A1 * | 6/2019 | Talledo | ............... | H01L 21/4842 |
| 2020/0098701 A1 * | 3/2020 | Harada | ............... | H01L 23/49586 |
| 2021/0098346 A1 * | 4/2021 | Okuyama | ............... | H01L 24/06 |

FOREIGN PATENT DOCUMENTS

| | | |
|---|---|---|
| JP | H08125069 A | 5/1996 |
| JP | 2015-029143 A | 2/2015 |
| JP | 2019-080417 A | 5/2019 |

* cited by examiner

SEMICONDUCTOR DEVICE

BACKGROUND OF THE INVENTION

Field of the Invention

The present invention relates to a semiconductor device.

Description of the Background Art

Conventionally, packages such as small outline packages (SOP) and small outline no leads (SON) have been widely used for surface-mount semiconductor devices. A surface-mount package is excellent in heat dissipation properties because the surface mount package is mounted with its lower surface in direct contact with a predetermined position such as a substrate.

An SOP-type semiconductor device includes a semiconductor element mounted on a die pad, leads, and an encapsulating resin. The leads are provided at both ends of a package and are electrically connected to the semiconductor element by bonding wires. The encapsulating resin forms the package in which the die pad, the semiconductor element, and a part of each of the leads are encapsulated. Japanese Patent Application Laid-Open No. H08-125069 (1996) discloses an example of an SOP-type semiconductor device. Such a semiconductor device has a protrusion provided on a lower surface of an encapsulating resin, and the semiconductor device is supported by the protrusion and leads. Further, the semiconductor device disclosed in Japanese Patent Application Laid-Open No. H08-125069 (1996) achieves high-density mounting by allowing leads of another package to get into a space below the package formed by the protrusion.

Although an SON-type semiconductor device has internal configuration similar to the SOP-type semiconductor device, the leads of the SON-type semiconductor device are formed by, for example, dicing and are made flush with the lower surface and side surfaces of the encapsulating resin.

In the SOP-type semiconductor device, when a gap is formed between the lower surface of the package and the height of the gull-wing leads, either poor contact between the lower surface of the package and the substrate or poor contact between the leads and the substrate tends to occur. Such poor contact deteriorates the reliability of the semiconductor device.

On the other hand, in the SON-type semiconductor device, the lower surface of the package and the leads are made flush with each other and thus come into secure contact with the substrate. However, the leads are required to have flatness and mechanical strength suitable for direct mounting on the substrate, and, from this viewpoint, a limit is put on the outer dimensions of the package. This in turn puts a limit on a reduction in pitch between the leads and an increase in number of the leads.

SUMMARY

An object of the present invention is to provide a semiconductor device that ensures reliability and allows a reduction in pitch between leads and an increase in number of the leads.

The semiconductor device includes a semiconductor element, a die pad, an encapsulating member, and a plurality of leads. The die pad has a front surface on which the semiconductor element is mounted. The encapsulating member covers and seals the semiconductor element. The plurality of leads each have a first end connected to the semiconductor element in an inside of the encapsulating member and a second end led out from a side surface of the encapsulating member. A lower surface of a package including the semiconductor element, the die pad, and the encapsulating member is located on a back surface side of the die pad and has a convexly curved shape.

According to the present invention, it is possible to provide a semiconductor device that ensures reliability and allows a reduction in pitch between the leads and an increase in number of the leads.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
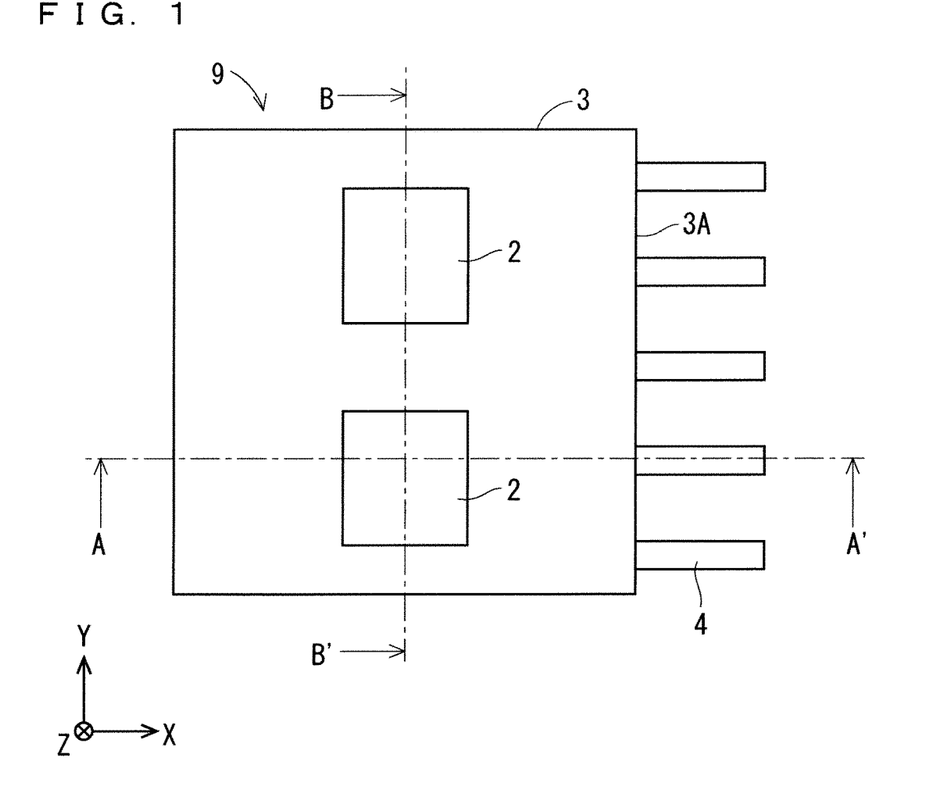
FIG. 1 is a bottom view of a configuration of a semiconductor device according to a first preferred embodiment.
Figure 2:
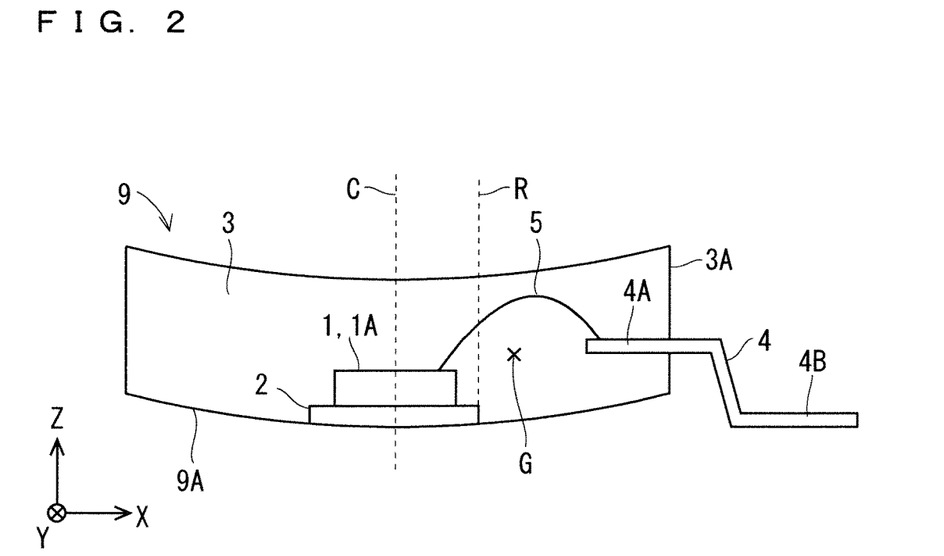
FIG. 2 is a cross-sectional view taken along line A-A' shown in FIG. 1.
Figure 3:
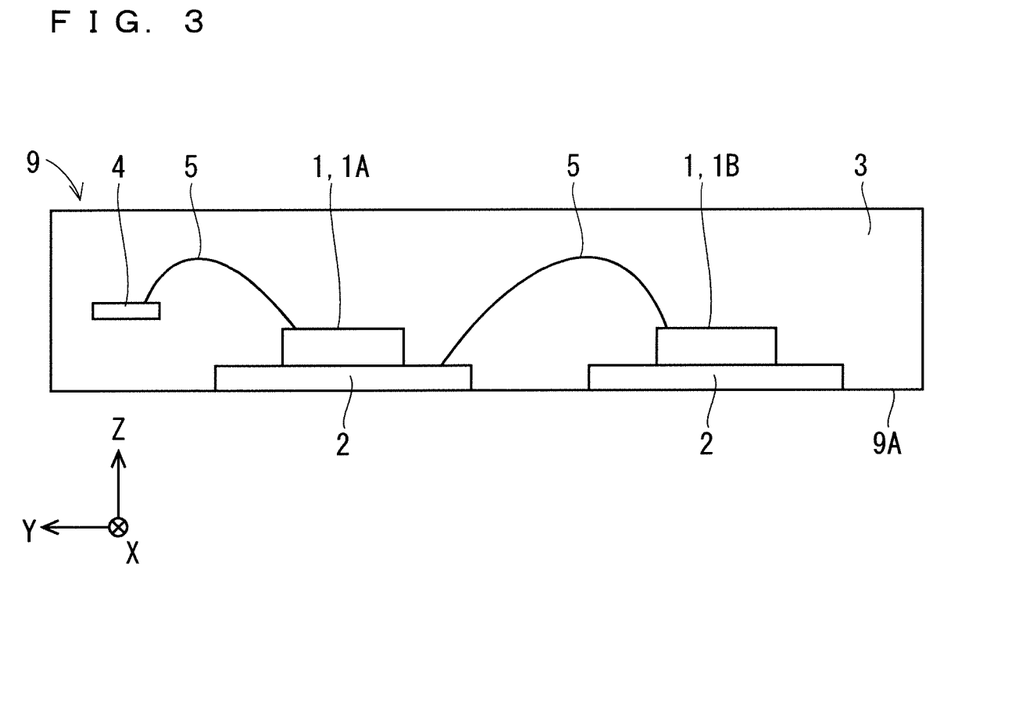
FIG. 3 is a cross-sectional view taken along line B-B' shown in FIG. 1.

FIG. 1 is a bottom view of a configuration of a semiconductor device according to a first preferred embodiment. FIG. 2 is a cross-sectional view taken along line A-A' shown in FIG. 1. FIG. 3 is a cross-sectional view taken along line B-B' shown in FIG. 1.

Figure 4:
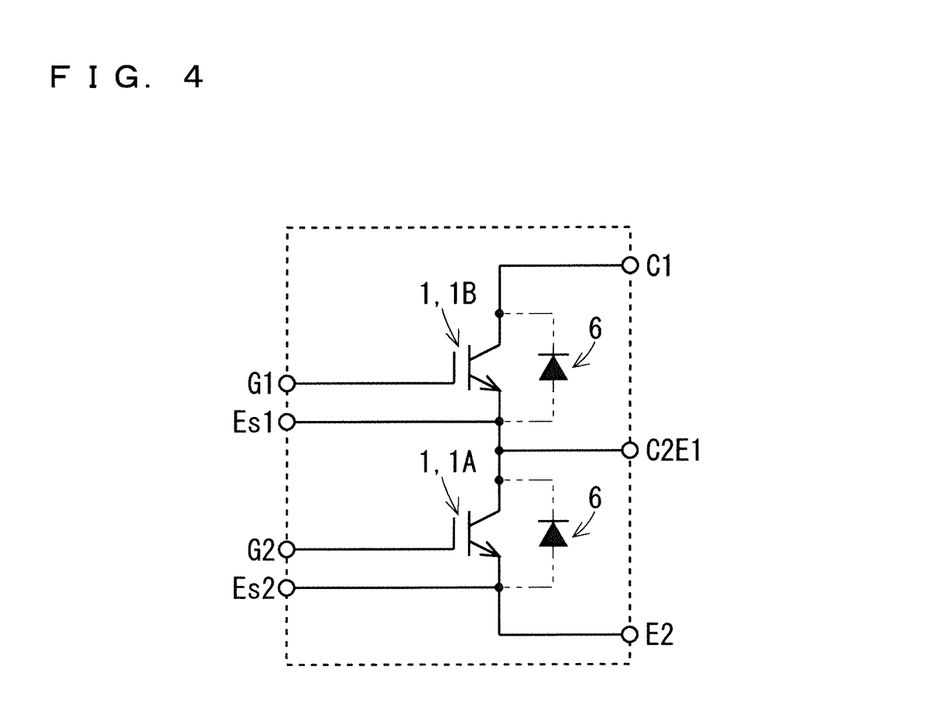
FIG. 4 is a connection diagram showing a connection configuration of the semiconductor device shown in FIG. 1.

FIG. 4 is a connection diagram showing a connection configuration of the semiconductor device shown in FIG. 1.

The semiconductor device includes a semiconductor element 1, a die pad 2, an encapsulating member 3, and a plurality of leads 4.

The semiconductor element 1 is a power semiconductor element such as an insulated gate bipolar transistor (IGBT), a metal oxide semiconductor field effect transistor (MOSFET), or a Schottky barrier diode. The semiconductor device according to the first preferred embodiment includes two semiconductor elements 1. The two semiconductor elements 1 include a low-side power semiconductor element 1A and a high-side power semiconductor element 1B.

The die pad 2 has conductivity and has a front surface on which the semiconductor element 1 is mounted. The semiconductor device according to the first preferred embodiment includes two die pads 2 for the low-side power semiconductor element 1A and the high-side power semiconductor element 1B. The low-side power semiconductor element 1A and the high-side power semiconductor element 1B are each fixed to the front surface of a corresponding die pad 2 by solder. Further, a back surface of the die pad 2 has a convexly curved shape.

The encapsulating member 3 has an insulating property. The encapsulating member 3 covers and seals the semiconductor element 1 and the front surface of the die pad 2. The encapsulating member 3 is, for example, resin. The encapsulating member 3 according to the first preferred embodiment is formed such that the back surface of the die pad 2 is exposed, and a back surface of the encapsulating member 3 is made flush with the curved shape of the die pad 2.

A package 9 includes the semiconductor element 1, the die pad 2, and the encapsulating member 3. A lower surface 9A of the package 9 is a surface located on the back surface side of the die pad 2. The lower surface 9A of the package 9 includes the back surface of the encapsulating member 3 and the back surface of the die pad 2 exposed from the encapsulating member 3. The lower surface 9A of the package 9 has a convexly curved shape and is flush with the back surface of the die pad 2 exposed from the encapsulating member 3. According to the first preferred embodiment, the convexly curved shape is a shape warped convexly in one direction on the lower surface 9A of the package 9. Specifically, as shown in FIGS. 2 and 3, the convexly curved shape is a shape that is warped in an X direction and is not warped in a Y direction.

The first end 4A of the lead 4 is connected to the semiconductor element 1 through a bonding wire 5 in the inside of the encapsulating member 3. The semiconductor device according to the first preferred embodiment includes five leads 4. The first end 4A of one of the five leads 4 is connected to an emitter electrode (not shown) of the low-side power semiconductor element 1A by the bonding wire 5.

The second end 4B of the lead 4 is led out from a side surface 3A of the encapsulating member 3. The leads 4 according to the first preferred embodiment protrude from the side surface 3A of the encapsulating member 3 and have a gull-wing shape.

A center of gravity G of a structure including the package 9 and the leads 4, that is, a center of gravity G of the semiconductor device is preferably shifted from a center C of the package 9 in plan view. The center of gravity G according to the first preferred embodiment is located between an end portion (right end R) of the die pad 2 and the side surface 3A from which the leads 4 are led out.

According to the first preferred embodiment, the leads 4 are led out from the side surface in one direction, among a plurality of side surfaces constituting an outer surface of the encapsulating member 3. The one direction corresponds to the X direction in which the lower surface 9A of the package 9 is warped. The five leads 4 are provided only on the side surface 3A that is a right side surface of the side surfaces oriented in the X direction. Such a configuration causes the center of gravity G to be shifted toward the side surface 3A from which the leads 4 are led out beyond the end portion (right end R) of the die pad 2. In other words, the position of the center of gravity G can be adjusted by changing the shape or material of the leads 4.

Next, a description will be given of electrical connection in the semiconductor device. Since the low-side power semiconductor element 1A and the high-side power semiconductor element 1B are each directly soldered to a corresponding die pad 2, the collector electrodes (not shown) are each electrically connected to the corresponding die pad 2.

The first end 4A of one of the five leads 4 is connected to the emitter electrode of the low-side power semiconductor element 1A by the bonding wire 5. The die pad 2 electrically connected to the collector electrode of the low-side power semiconductor element 1A is connected to an emitter electrode (not shown) of the high-side power semiconductor element 1B by the bonding wire 5.

Although not shown, a gate electrode and emitter sense electrode of the low-side power semiconductor element 1A are each connected to the first end 4A of a corresponding one of two leads 4 different from the above-described lead 4 by the bonding wire 5. Similarly, a gate electrode and emitter sense electrode of the high-side power semiconductor element 1B are each connected to the first end 4A of a corresponding one of the remaining two leads 4 by the bonding wire 5.

As shown in FIG. 4, the low-side power semiconductor element 1A and the high-side power semiconductor element 1B are connected in series. In FIG. 4, the collector electrode of the high-side power semiconductor element 1B is denoted by C1. The emitter electrode of the high-side power semiconductor element 1B and the collector electrode of the low-side power semiconductor element 1A are denoted by C2E1. The emitter electrode of the low-side power semiconductor element 1A is denoted by E2. The gate electrode of the high-side power semiconductor element 1B and the gate electrode of the low-side power semiconductor element 1A are denoted by G1 and G2, respectively. The emitter sense electrodes are denoted by Es1 and Es2. Note that, as represented by long dashed double-short dashed lines in FIG. 4, a free wheeling diode 6 may be connected in parallel across the collector and emitter of each of the low-side power semiconductor element 1A and the high-side power semiconductor element 1B.

Figure 5:
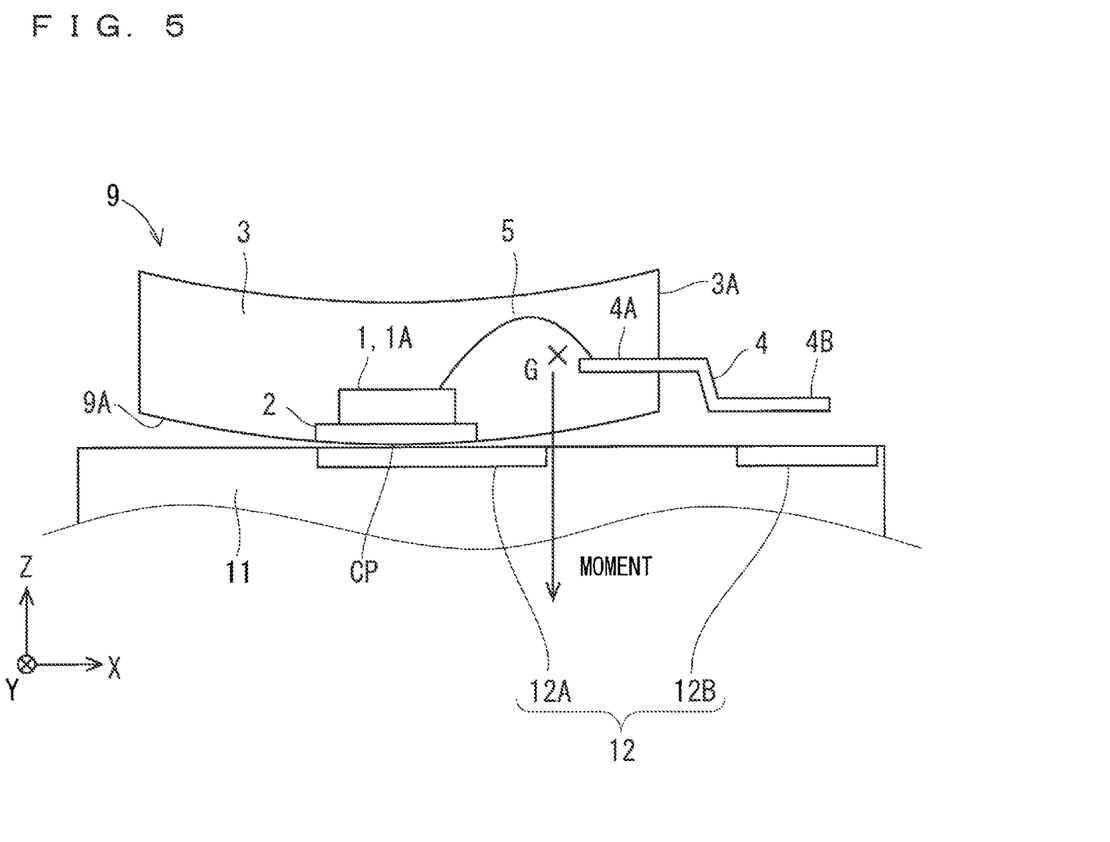
FIGS. 5 to 8 are cross-sectional views of the semiconductor device according to the first preferred embodiment, each showing a state where the semiconductor device is about to be mounted on a printed circuit board.
Figure 6:
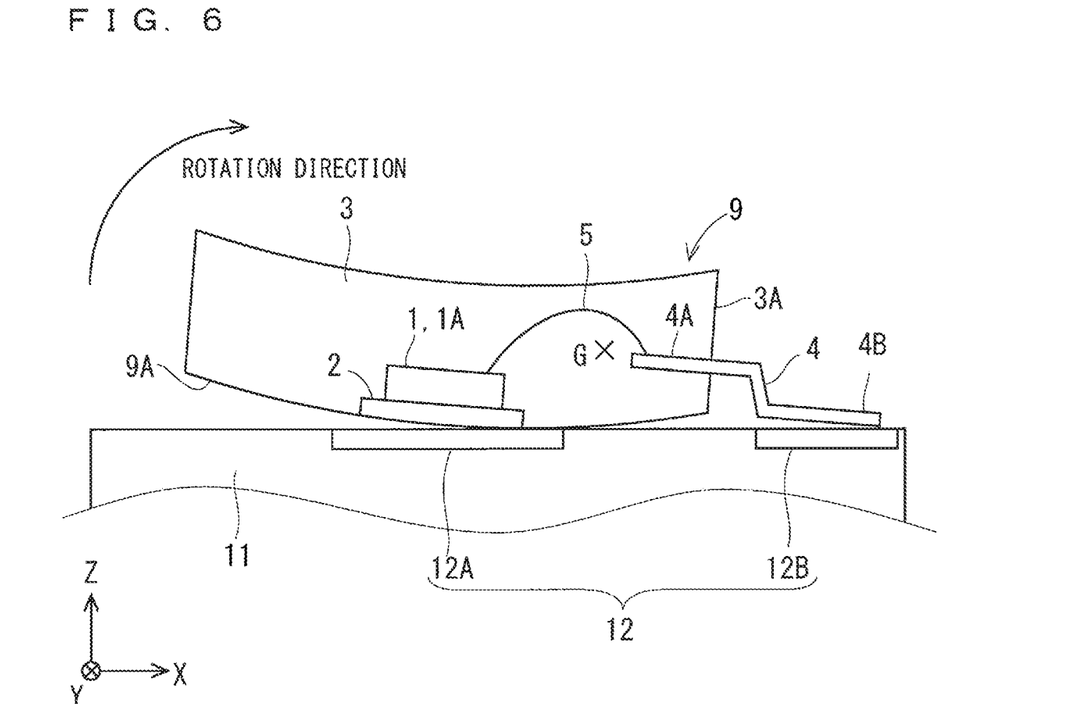
Figure 7:
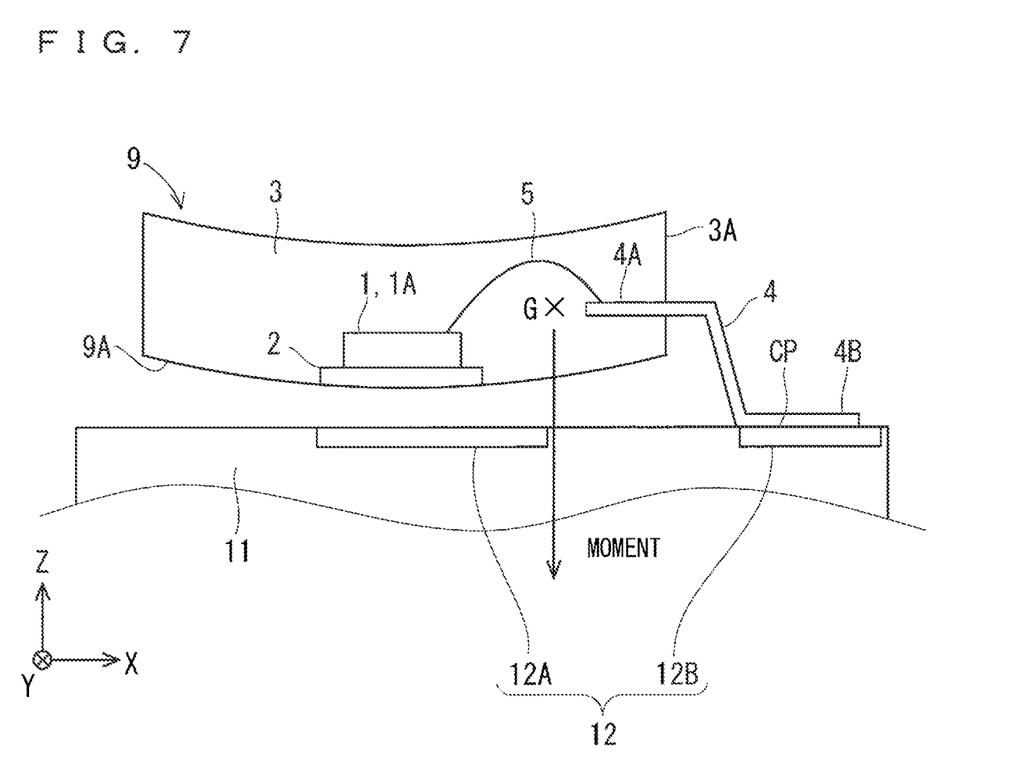
Figure 8:
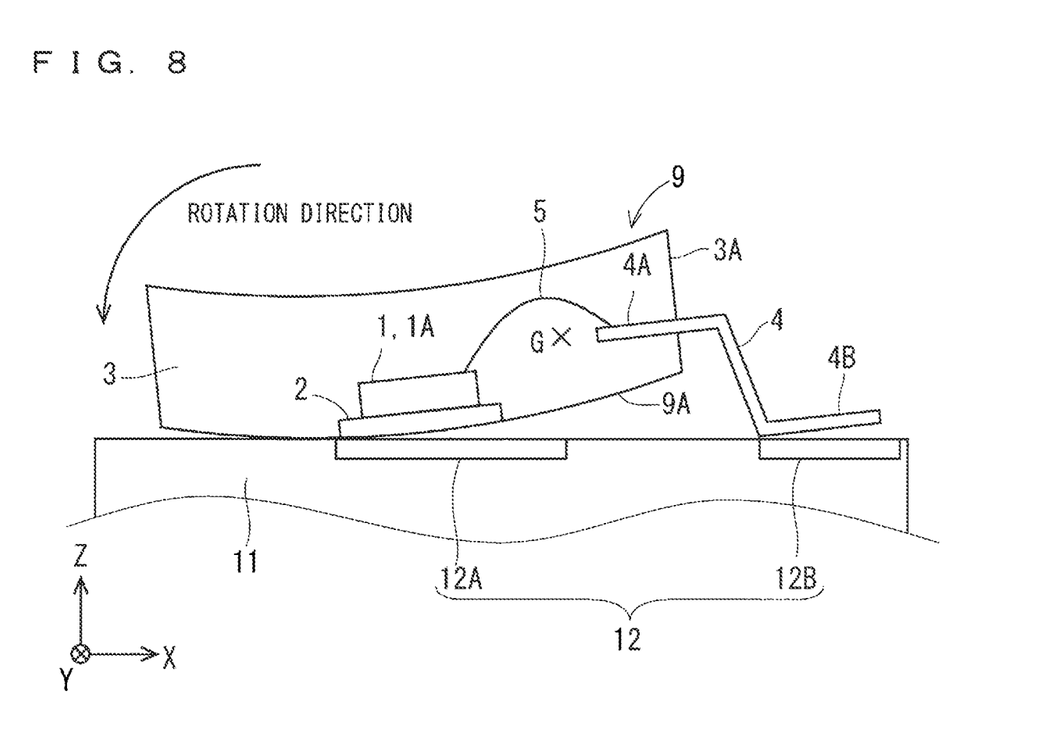

FIGS. 5 to 8 are cross-sectional views of the semiconductor device according to the first preferred embodiment, each showing a state where the semiconductor device is about to be mounted on a printed circuit board 11. FIGS. 5 and 6 show a case where the second end 4B of the lead 4 is at a position higher than a predetermined position. FIGS. 7 and 8 show a case where the second end 4B of the lead 4 is at a position lower than the predetermined position. Herein, the predetermined position corresponds to a state where the second end 4B of the lead 4 is equal in height to a horizontal plane including an apex of the lower surface 9A of the package 9. Such variations in height of the second ends 4B of the leads 4 are caused by variations in manufacture of the semiconductor device such as a deviation of a position where the leads 4 protrude from the encapsulating member 3 from a designed position or a deviation of a shape of the leads 4 from a designed shape. The printed circuit board 11 is provided with a substrate electrode 12 at a predetermined position. Herein, the printed circuit board 11 includes, as the substrate electrode 12, a substrate electrode 12A to be connected to the back surface of the die pad 2, and a substrate electrode 12B to be connected to the second end 4B of the lead 4.

As shown in FIG. 5, when the second end 4B of the lead 4 is at a position higher than the predetermined position, the die pad 2 located at the apex of the lower surface 9A of the package 9 is in contact with the substrate electrode 12A of the printed circuit board 11. In contrast, the second end 4B of the lead 4 is not in contact with the substrate electrode 12B. Further, in this state, the center of gravity G and a contact point CP between the die pad 2 and the substrate electrode 12A are not aligned with each other in a gravity direction (−Z direction).

Accordingly, a moment is produced in a direction indicated by an arrow shown in FIG. 5. This causes, as shown in FIG. 6, the semiconductor device to rotate clockwise. At this time, the semiconductor device keeps rotating until the contact point CP and the center of gravity G are aligned with each other in the gravity direction or until the second end 4B of the lead 4 comes into contact with the substrate electrode 12B. Herein, the semiconductor device stops when the second end 4B of the lead 4 comes into contact with the substrate electrode 12B. Both the back surface of the die pad 2 and the second end 4B of the lead 4 are in contact with the substrate electrodes 12. In this state, the back surface of the die pad 2 and the second end 4B of the lead 4 are soldered to the substrate electrodes 12A and 12B, respectively. As a result, the die pad 2 is fixed to the substrate electrode 12A with being in secure contact with the substrate electrode 12A, and the second end 4B of the lead 4 is fixed to the substrate electrode 12B with being in secure contact with the substrate electrode 12B.

As shown in FIG. 7, when the lead 4 is at a position lower than the predetermined position, the second end 4B of the lead 4 is in contact with the substrate electrode 12B. In contrast, the die pad 2 located at the apex of the lower surface 9A of the package 9 is not in contact with the substrate electrode 12A.

Accordingly, a moment is produced in a direction indicated by an arrow shown in FIG. 7. This causes, as shown in FIG. 8, the semiconductor device to rotate counterclockwise. Then, the semiconductor device stops when the back surface of the die pad 2 comes into contact with the substrate electrode 12A. In this state, the back surface of the die pad 2 and the second end 4B of the lead 4 are each soldered to a corresponding substrate electrode 12. As a result, the die pad 2 is fixed to the substrate electrode 12A with being in secure contact with the substrate electrode 12A, and the second end 4B of the lead 4 is fixed to the substrate electrode 12B with being in secure contact with the substrate electrode 12B.

As described above, the configuration where the leads 4 are provided only on the side surface 3A causes the center of gravity G to shift, and the configuration where the lower surface 9A of the package 9 has a convexly curved shape causes the semiconductor device to rotate. This mitigates the effects of the variations in height of the leads 4.

In summary, the semiconductor device according to the first preferred embodiment includes the semiconductor element 1, the die pad 2, the encapsulating member 3, and the plurality of leads 4. The die pad 2 has the semiconductor element 1 mounted on the front surface of the die pad 2. The encapsulating member 3 covers and seals the semiconductor element 1. The plurality of leads 4 each have the first end 4A connected to the semiconductor element 1 in the inside of the encapsulating member 3 and the second end 4B led out from the side surface 3A of the encapsulating member 3. The lower surface 9A of the package 9 including the semiconductor element 1, the die pad 2, and the encapsulating member 3 is located on the back surface side of the die pad 2 and has a convexly curved shape.

Such a semiconductor device allows both the die pad 2 and the leads 4 to come into secure contact with and be fixed to the substrate electrodes 12 of the printed circuit board 11 even when the second ends 4B of the leads 4 vary in height due to manufacturing variations. This increases reliability in heat dissipation properties and electrical properties. Further, it is not necessary to strictly control a manufacturing accuracy regarding the flatness of the package 9 and the height of the leads 4, thereby allowing the semiconductor device to be easily manufactured. Furthermore, since the leads 4 have a gull-wing shape, a reduction in pitch between the leads 4 and an increase in number of the leads 4 can be made as compared to a flat-lead package, a no-lead package, or the like. The surface-mount semiconductor device having such a configuration is suitable for a power semiconductor device for driving an electric motor.

Further, the center of gravity G of the structure including the package 9 and the plurality of leads 4 according to the first preferred embodiment is shifted from the center C of the package 9 in plan view.

Such a semiconductor device allows both the die pad 2 and the second ends 4B of the leads 4 to come into contact with and be fixed to the substrate electrodes 12 even when the leads 4 are displaced from the predetermined position.

Further, the convexly curved shape of the semiconductor device according to the first preferred embodiment is a shape warped convexly in one direction on the lower surface 9A of the package 9. The plurality of leads 4 are led out from the side surface 3A in the one direction, among the plurality of side surfaces constituting the outer surface of the encapsulating member 3.

In such a semiconductor device, even when the leads 4 are displaced from the predetermined position, the package 9 rotates in the one direction to allow both the die pad 2 and the second ends 4B of the leads 4 to come into contact with and be fixed to the substrate electrodes 12.

Second Preferred Embodiment

A description will be given of a semiconductor device according to a second preferred embodiment. The second preferred embodiment is a subordinate concept to the first preferred embodiment, and the semiconductor device according to the second preferred embodiment includes each configuration of the semiconductor device according to the first preferred embodiment. Note that no descriptions will be given of configuration and operation similar to the configuration and operation of the first preferred embodiment.

Figure 9:
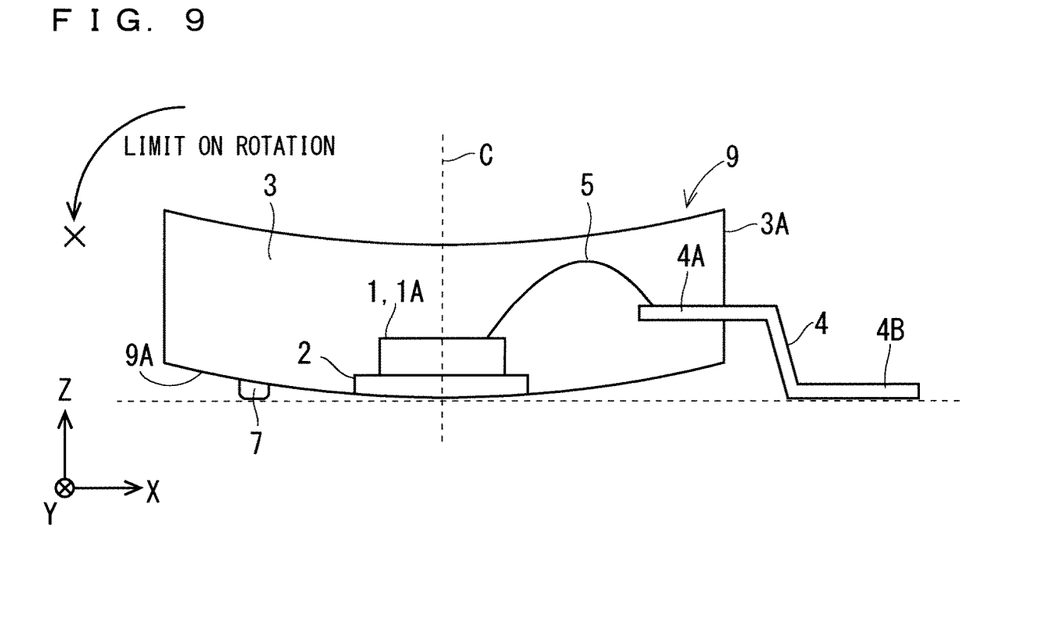
FIG. 9 is a cross-sectional view of a configuration of a semiconductor device according to a second preferred embodiment.

FIG. 9 is a cross-sectional view of a configuration of the semiconductor device according to the second preferred embodiment.

The encapsulating member 3 includes a protrusion 7 on the back surface. That is, the encapsulating member 3 includes the protrusion 7 on the lower surface 9A of the package 9. The protrusion 7 is made of the same material as the material of which the encapsulating member 3 is made and has a shape in which a part of the lower surface of the encapsulating member 3 protrudes. The protrusion 7 is provided on the lower surface 9A of the package 9 on a side opposite to the side where the leads 4 are provided with respect to the center C of the package 9. Further, the protrusion 7 according to the second preferred embodiment is located in the vicinity of the die pad 2.

The presence of the protrusion 7 puts a limit on counterclockwise rotation of the package 9 as indicated by an arrow shown in FIG. 9 and restricts the package 9 to clockwise rotation. The protrusion 7 prevents the semiconductor device from rotating or wobbling from a predetermined position during assembly or transport. Further, as shown in the first preferred embodiment, when the leads 4 protrude from a position lower than the predetermined position, the protrusion 7 prevents the semiconductor device from excessively rotating counterclockwise. As a result, both the die pad 2 and the leads 4 come into secure contact with the respective substrate electrodes 12. As described above, the protrusion 7 serves as a stopper.

Third Preferred Embodiment

A description will be given of a semiconductor device according to a third preferred embodiment. The third preferred embodiment is a subordinate concept to the first preferred embodiment, and the semiconductor device according to the third preferred embodiment includes each configuration of the semiconductor device according to the first preferred embodiment. Note that no descriptions will be given of configuration and operation similar to the configuration and operation of the first or second preferred embodiment.

Figure 10:
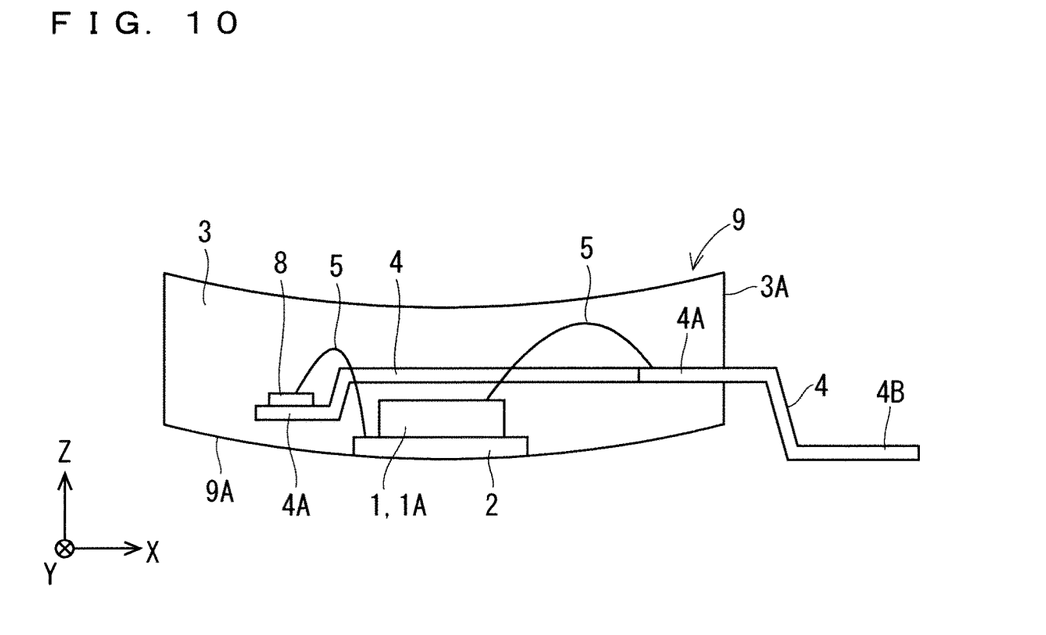
FIGS. 10 and 11 are cross-sectional views of a configuration of a semiconductor device according to a third preferred embodiment.
Figure 11:
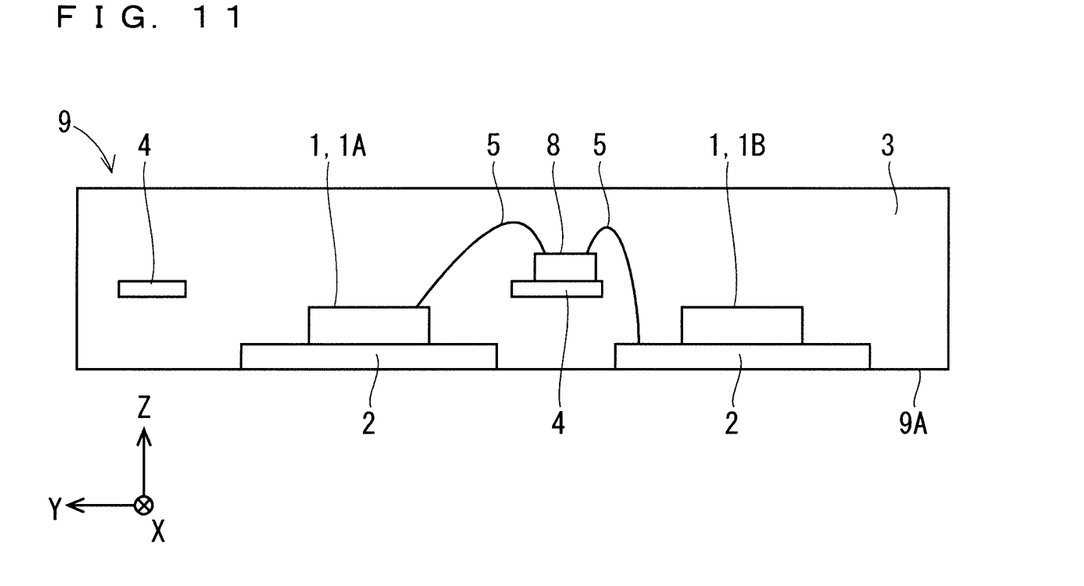

FIGS. 10 and 11 are cross-sectional views of a configuration of the semiconductor device according to the third preferred embodiment.

The semiconductor device further includes a snubber capacitor 8 provided in the inside of the encapsulating member 3. The snubber capacitor 8 is mounted on a first end 4A of a lead 4 other than the leads 4 shown in the first preferred embodiment. The other lead 4 extends from the side surface 3A of the encapsulating member 3 from which the leads 4 are led out in a direction toward a side surface opposite to the side surface 3A.

The first electrode of the snubber capacitor 8 is connected to the collector electrode of the high-side power semiconductor element 1B by the bonding wire 5. The second electrode of the snubber capacitor 8 is connected to the emitter electrode of the low-side power semiconductor element 1A by the bonding wire 5. Connections other than the connections of the snubber capacitor 8 are the same as the connections shown in FIG. 3 and are thus omitted in FIG. 11. As described above, the snubber capacitor 8 is connected to the semiconductor element 1 in parallel.

A snubber circuit including the snubber capacitor 8 is connected to an opposite side of the semiconductor element 1 from the side surface 3A from which the leads 4 are led out without crossing or interfering with the semiconductor element 1 and control circuit wiring. The snubber capacitor 8 is located in the immediate vicinity of the semiconductor element 1 and connected to the semiconductor element 1.

Such a configuration makes it possible to reduce the inductance of the wiring and in turn reduce the surge voltage during a switching operation.

Fourth Preferred Embodiment

A description will be given of a semiconductor device according to a fourth preferred embodiment. The fourth preferred embodiment is a subordinate concept to the first preferred embodiment, and the semiconductor device according to the fourth preferred embodiment includes each configuration of the semiconductor device according to the first preferred embodiment. Note that no descriptions will be given of configuration and operation similar to the configuration and operation of any one of the first to third preferred embodiments.

Figure 12:
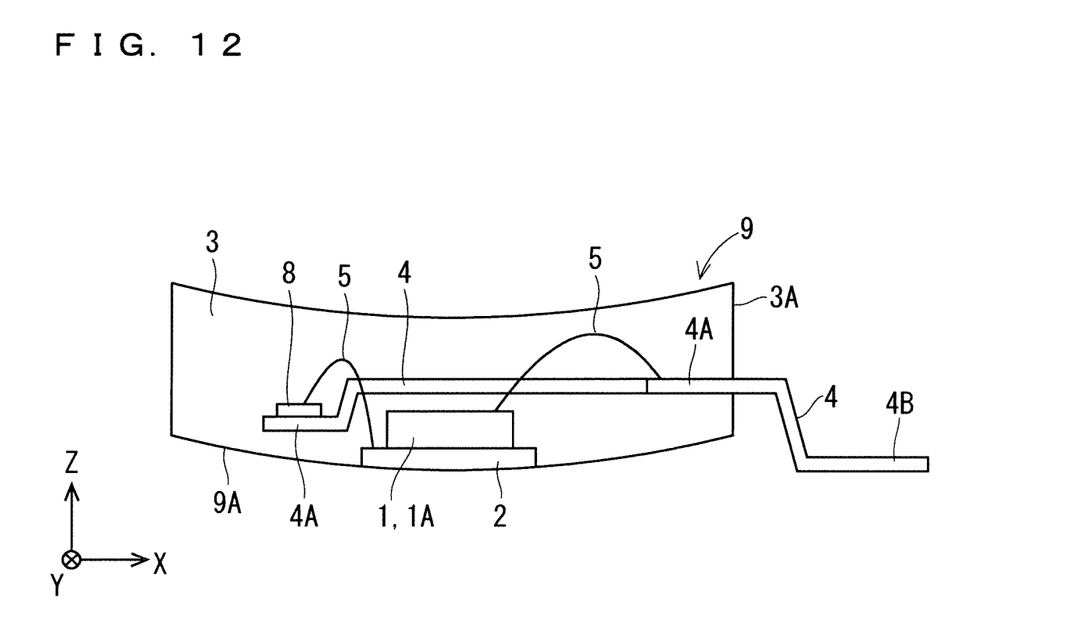
FIG. 12 is a cross-sectional view of a configuration of a semiconductor device according to a fourth preferred embodiment.

FIG. 12 is a cross-sectional view of a configuration of the semiconductor device according to the fourth preferred embodiment. The semiconductor device includes the snubber capacitor 8 as in the third preferred embodiment.

The semiconductor element 1 according to the fourth preferred embodiment contains a wide band gap semiconductor such as silicon carbide (SiC) as a material.

The semiconductor element 1 containing a wide band gap semiconductor as a material is capable of high-speed switching operations as compared to the semiconductor element 1 made from a typical silicon semiconductor. In contrast, the surge voltage during the switching operation is large. According to the fourth preferred embodiment, the snubber capacitor 8 located in the immediate vicinity of the semiconductor element 1 and connected to the semiconductor element 1 reduces the surge voltage.

Such a semiconductor device achieves both the high-speed switching operation of the semiconductor element 1 and the suppression of the surge voltage during the switching operation.

The wide band gap semiconductor is not limited to silicon carbide. Even other wide band gap semiconductors such as gallium nitride (GaN) have the same effects as described above.

Fifth Preferred Embodiment

A description will be given of a semiconductor device according to a fifth preferred embodiment. The fifth preferred embodiment is a subordinate concept to the first preferred embodiment, and the semiconductor device according to the fifth preferred embodiment includes each configuration of the semiconductor device according to the first preferred embodiment. Note that no descriptions will be given of configuration and operation similar to the configuration and operation of any one of the first to fourth preferred embodiments.

Figure 13:
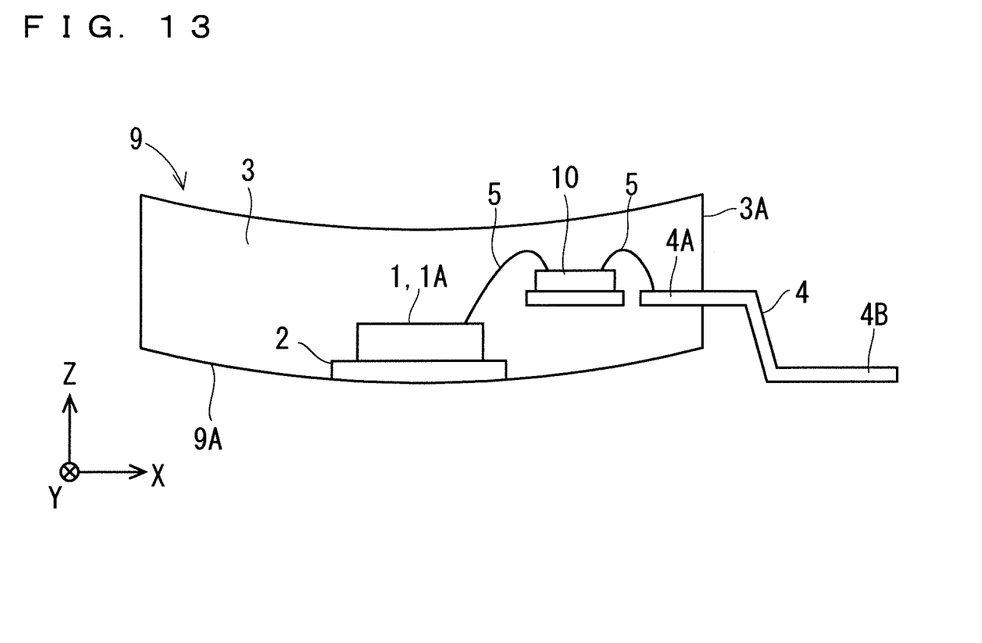
FIG. 13 is a cross-sectional view of a configuration of a semiconductor device according to a fifth preferred embodiment.
Figure 14:
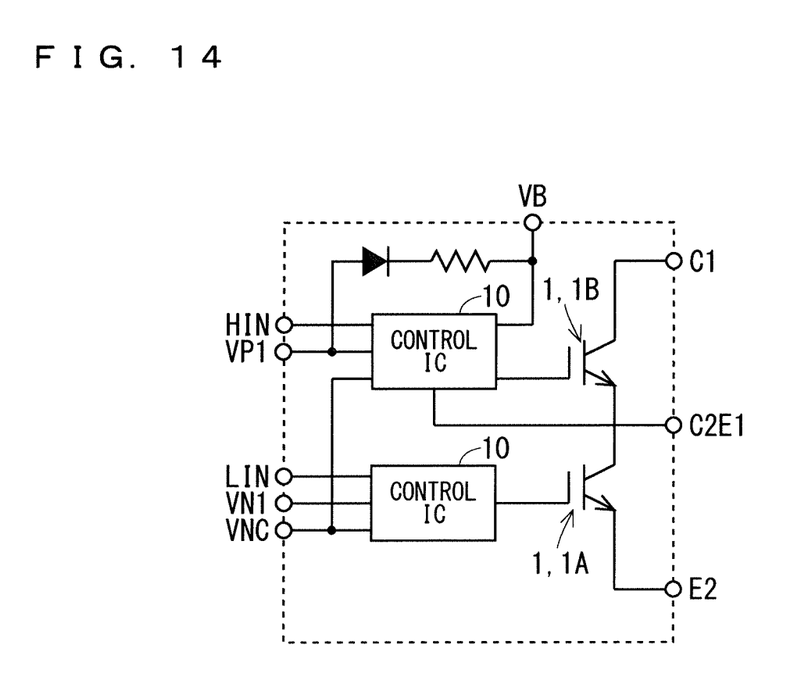
FIG. 14 is a connection diagram showing a connection configuration of the semiconductor device shown in FIG. 13.

FIG. 13 is a cross-sectional view of a configuration of the semiconductor device according to the fifth preferred embodiment. FIG. 14 is a connection diagram showing a connection configuration of the semiconductor device shown in FIG. 13.

The semiconductor device includes a control integrated circuit (IC) 10 that is provided in the inside of the encapsulating member 3 and controls drive of the semiconductor element 1. Herein, the semiconductor device includes two control ICs 10 that each control the drive of a corresponding one of the high-side power semiconductor element 1B and the low-side power semiconductor element 1A.

The leads 4 and the control ICs 10 are connected by the bonding wires 5, and the control ICs 10 and the semiconductor element 1 are also connected by the bonding wires 5.

In FIG. 14, a control input signal terminal of the control IC 10 connected to the high-side power semiconductor element 1B is denoted by HIN, a control power supply terminal is denoted by VP1, and a drive power supply terminal is denoted by VB. A control input signal terminal of the control IC 10 connected to the low-side power semiconductor element 1A is denoted by LIN, and a control power supply terminal is denoted by VN1. A control GND terminal of the two control ICs 10 is denoted by VNC.

The installation of the control ICs 10 increases the number of leads 4. However, since the leads 4 have a gull-wing shape, the semiconductor device according to the fifth preferred embodiment allows a reduction in pitch between the leads 4 and an increase in number of the leads 4 without an increase in manufacturing accuracy, as compared to a flat-lead package, a no-lead package, or the like.

Note that, in the fifth preferred embodiment, only the terminals necessary for driving the semiconductor element 1 are shown as the terminals of the control ICs 10.

However, another lead 4 and bonding wire 5 corresponding to a function of the control ICs 10 such as an error signal output terminal and an analog temperature output terminal may be additionally provided.

Further, the semiconductor device according to the fifth preferred embodiment may be configured to include one control IC that controls drive of both the high-side power semiconductor element 113 and the low-side power semiconductor element 1A instead of the two control ICs 10.

Note that the present invention can be implemented by any combination of the preferred embodiments within the scope of the present invention, and each of the preferred embodiments can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor element;
a die pad having a front surface on which the semiconductor element is mounted;
an encapsulating member covering and sealing the semiconductor element;
a plurality of leads each having a first end connected to the semiconductor element in an inside of the encapsulating member and a second end led out from a side surface of the encapsulating member; and
a package including the semiconductor element, the die pad, and the encapsulating member, wherein:
a lower surface of the package includes a back surface of the die pad and at least the back surface of the die pad has a convexly curved shape,
the convexly curved shape is a shape warped convexly along a predetermined direction on the lower surface of the package, the predetermined direction being perpendicular to the side surface from which the plurality of leads are led out,
an extending direction of the plurality of leads corresponds to the predetermined direction, and
the back surface of the die pad is continuously convexly curved along a length of the die pad.

2. The semiconductor device according to claim 1, wherein
a center of gravity of a structure including the package and the plurality of leads is shifted from a center of the package in plan view.

3. The semiconductor device according to claim 1 further comprising a control integrated circuit (IC) provided in the inside of the encapsulating member and configured to control drive of the semiconductor element.

4. The semiconductor device according to claim 1 further comprising a snubber capacitor provided in the inside of the encapsulating member and connected to the semiconductor element in parallel.

5. The semiconductor device according to claim 1, wherein
the semiconductor element contains a wide band gap semiconductor as a material.

6. The semiconductor device according to claim 1, wherein
the encapsulating member includes a protrusion on the lower surface of the package.

7. A semiconductor device comprising:
a semiconductor element;
a die pad having a front surface on which the semiconductor element is mounted;
an encapsulating member covering and sealing the semiconductor element;
a plurality of leads each having a first end connected to the semiconductor element in an inside of the encapsulating member and a second end led out from a side surface of the encapsulating member; and
a package including the semiconductor element, the die pad, and the encapsulating member, wherein:
a lower surface of the package includes a back surface of the die pad, and at least the encapsulating member and the back surface of the die pad have a convexly curved shape,
the convexly curved shape is a shape warped convexly along a predetermined direction on the lower surface of the package, the predetermined direction being perpendicular to the side surface from which the plurality of leads are led out,
an extending direction of the plurality of leads corresponds to the predetermined direction, and
the back surface of the die pad is continuously convexly curved along a length of the die pad.

8. A semiconductor device comprising:
a semiconductor element;
a die pad having a front surface on which the semiconductor element is mounted;
an encapsulating member covering and sealing the semiconductor element;
a plurality of leads each having a first end connected to the semiconductor element in an inside of the encapsulating member and a second end led out from a side surface of the encapsulating member; and
a package including the semiconductor element, the die pad, and the encapsulating member, wherein:
a lower surface of the package includes a back surface of the die pad and at least the back surface of the die pad has a convexly curved shape,
the convexly curved shape is a shape warped convexly along the lower surface of the package in a predetermined direction, the predetermined direction being perpendicular to the side surface from which the plurality of leads are led out,
an extending direction of the plurality of leads corresponds to the predetermined direction, and
the back surface of the die pad is continuously convexly curved along a length of the die pad.

9. A semiconductor device comprising:
a semiconductor element;
a die pad having a front surface on which the semiconductor element is mounted;
an encapsulating member covering and sealing the semiconductor element;
a plurality of leads each having a first end connected to the semiconductor element in an inside of the encapsulating member and a second end led out from a side surface of the encapsulating member; and
a package including the semiconductor element, the die pad, and the encapsulating member, wherein:

a lower surface of the package includes a back surface of the die pad, and at least the encapsulating member and the back surface of the die pad have a convexly curved shape, the convexly curved shape is a shape warped convexly along the lower surface of the package in a predetermined direction, the predetermined direction being perpendicular to the side surface from which the plurality of leads are led out, an extending direction of the plurality of leads corresponds to the predetermined direction, and the back surface of the die pad is continuously convexly curved along a length of the die pad.

10. The semiconductor device according to claim 1, wherein the plurality of leads extends from only one side surface of the package.

11. The semiconductor device according to claim 7, wherein the plurality of leads extends from only one side surface of the package.

12. The semiconductor device according to claim 8, wherein the plurality of leads extends from only one side surface of the package.

13. The semiconductor device according to claim 9, wherein the plurality of leads extends from only one side surface of the package.

* * * * *